United States Patent [19]

Young et al.

[11] 4,386,315

[45] May 31, 1983

[54] ELECTRIC FIELD DETECTOR

[75] Inventors: Jeff F. Young, Mississauga; Daniel Friedmann, North Vancouver, both of Canada

[73] Assignee: Friedmann, Youn and Associates Inc., Vancouver, Canada

[21] Appl. No.: 142,815

[22] Filed: Apr. 22, 1980

[51] Int. Cl.³ .................. G01R 19/26; G01R 29/08
[52] U.S. Cl. .................................. 324/120; 324/72; 324/96; 324/122; 340/600
[58] Field of Search ............... 324/122, 96, 95, 72, 324/72.5, 120; 315/248; 455/67; 340/600

[56] References Cited

U.S. PATENT DOCUMENTS 3,328,690 6/1967 Lockie et al. .................. 324/122

FOREIGN PATENT DOCUMENTS 540068 10/1941 United Kingdom ............... 324/122

OTHER PUBLICATIONS

Anderson, J. M., "Electrodeless . . . ", Applied Physics Letters, v. 16, No. 12, Jun. 15, 1970, pp. 531–533.
El-Bakkal et al, "Electrical Breakdown . . . ", Journal of Applied Physics, v. 33, No. 4, Apr. 1962, pp. 1567–1577.

Primary Examiner—Ernest F. Karlsen
Attorney, Agent, or Firm—Fleit, Jacobson & Cohn

[57] ABSTRACT

Apparatus for detecting electric fields and providing an indication of their magnitude includes a glass bulb containing a gas such as neon. When the bulb is placed in a time varying electric field, pulses of electromagnetic radiation are generated within the bulb. The number of pulses is proportional to the magnitude of the variation in the electric field. The pulses are transmitted by a fibre optic bundle to detection and recording apparatus to provide an indication of the magnitude.

10 Claims, 3 Drawing Figures

ELECTRIC FIELD DETECTOR

The present invention relates to apparatus for detecting electric fields and more particularly to apparatus that may be used to determine the magnitude of an electric field induced by alternating current conductors.

It has long been recognized that an electric conductor will generate an electric field in its immediate environment. Common sources of such fields are overhead high voltage power transmission lines and switch yards.

The field generated by such lines is usually apparent as localized radio interference or corona discharge, but there is now evidence that these fields may indeed constitute a health hazard.

A difficulty facing researchers in this area is the lack of equipment for measuring the magnitude of the electric field. The equipment that is available is bulky and has employed conducting electrodes which cause perturbation of the field being measured. The data transmission from such instruments is subject to noise since it is located in an electric field and the equipment tends to be directional so that careful adjustment and positioning of the equipment is required. Thus the equipment presently available is not satisfactory for simple and reliable monitoring of such electric fields.

Attempts have been made to monitor exposure to electric fields by dosimeters which integrate the field over a relatively long period of time, i.e., 1 day. However, such a device does not provide an indication of localised field conditions and cannot be used to provide comparative information on fields at different locations.

It is therefore, an object of the present invention to provide apparatus in which the above disadvantages are obviated or mitigated.

The present invention is based upon the discovery that a bulb of dielectric material filled with a suitable gas and placed in time varying electric field will emit pulses of electromagnetic radiation, the number of which is in proportion to the change in magnitude of an electric field. In a continuously varying electric field, such as generated by an a.c. conductor, the average frequency of the pulses is an indication of the magnitude of the electric field. Thus, it is simply necessary to count the pulses emitted from the bulb over a fixed time interval to obtain a signal proportional to the magnitude of the electric field.

The electromagnetic pulses may be transmitted from the bulb by means of an optic fibre bundle to a recording device located at a remote location. This enables the recording device to be located outside the immediate vicinity of the electric field being measured and by choosing a dielectric material for the optic fibre bundles, the pick-up of noise is avoided. It has been found that the recording device may normally be located within 1 to 2 meters of the bulb to avoid perturbation of the measured field. In special circumstances however the optic fibre bundle will permit greater spacing if required.

An embodiment of the invention will now be described by way of example only with reference to the accompanying drawings in which.

Figure 1:
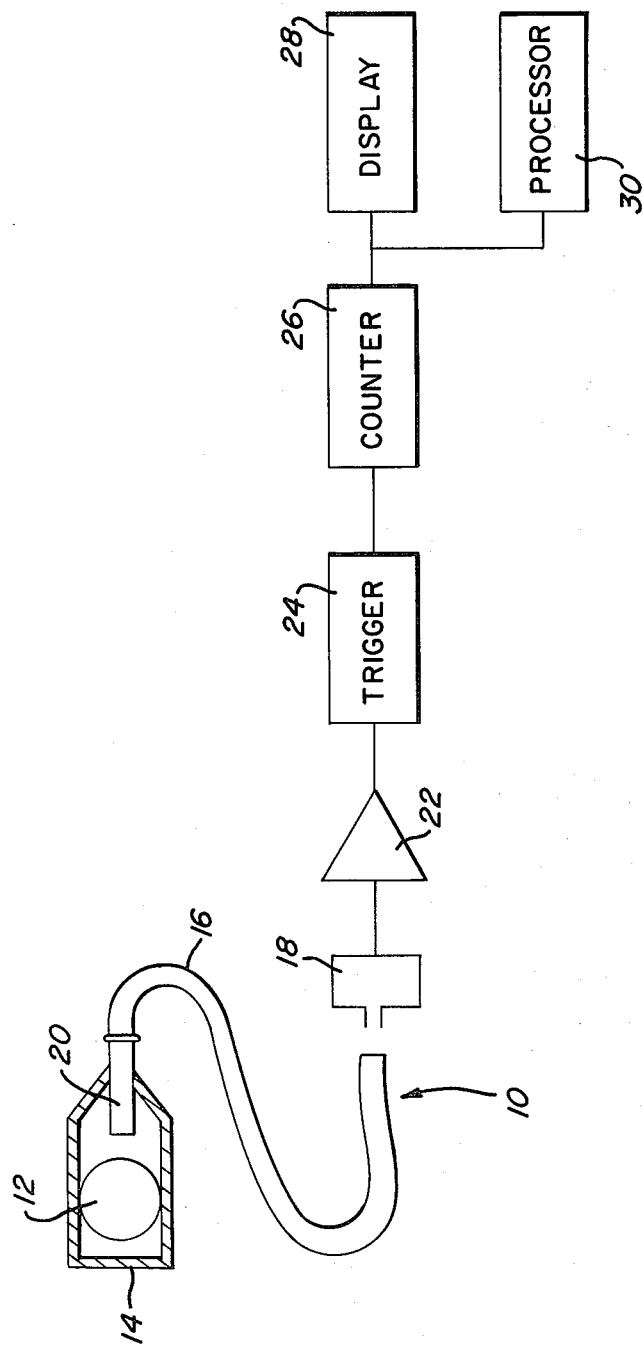
FIG. 1 is a diagrammatic representation of an electric field detection apparatus.

Referring now to FIG. 1, an electric field detector 10 comprises a sealed bulb 12 located within a housing 14. The bulb 12 is made from a dielectric material, such as glass, which transmits electromagnetic radiation at optical wave lengths and is filled with neon gas to a predetermined pressure.

The housing 14, which is preferably sealed, is made from a dielectric material such as teflon. Teflon has been found useful since it also protects the surface of the housing from adverse humidity effects.

An optic fibre bundle 16 extends between the housing 14 and a photodetector 18. An input end 20 of the bundle 16 passes through the housing 14 and is located adjacent the bulb 12 so as to receive electromagnetic radiation from the bulb 12. The photodetector 18 is connected to an amplifier 22 which transmits a signal to a threshold trigger device 24. The output of the threshold trigger device 24 is connected to a digital counter 26 whose output is displayed on a display device 28 and recorded on a microprocessor 30.

In operation, the housing 14 is located within an electric field which varies with time. Variations in the magnitude of the electric field cause the gas within the bulb 12 to emit pulses of electromagnetic radiation. The pulses are transmitted by the optic fibre bundle 16 to the photodetector 18 which produces a signal for each pulse at the input to the amplifier 22. An amplified signal is transmitted to the threshold trigger device 24 which determines whether the signal is above a predetermined magnitude, and, if it is, generates a signal that is recorded in the digital counter 24. Since the average frequency of the pulses in the bulb 12 is proportional to the change in magnitude of the electric field, the number of pulses obtained over a predetermined time is an indication of the electric field strength.

Figure 2:
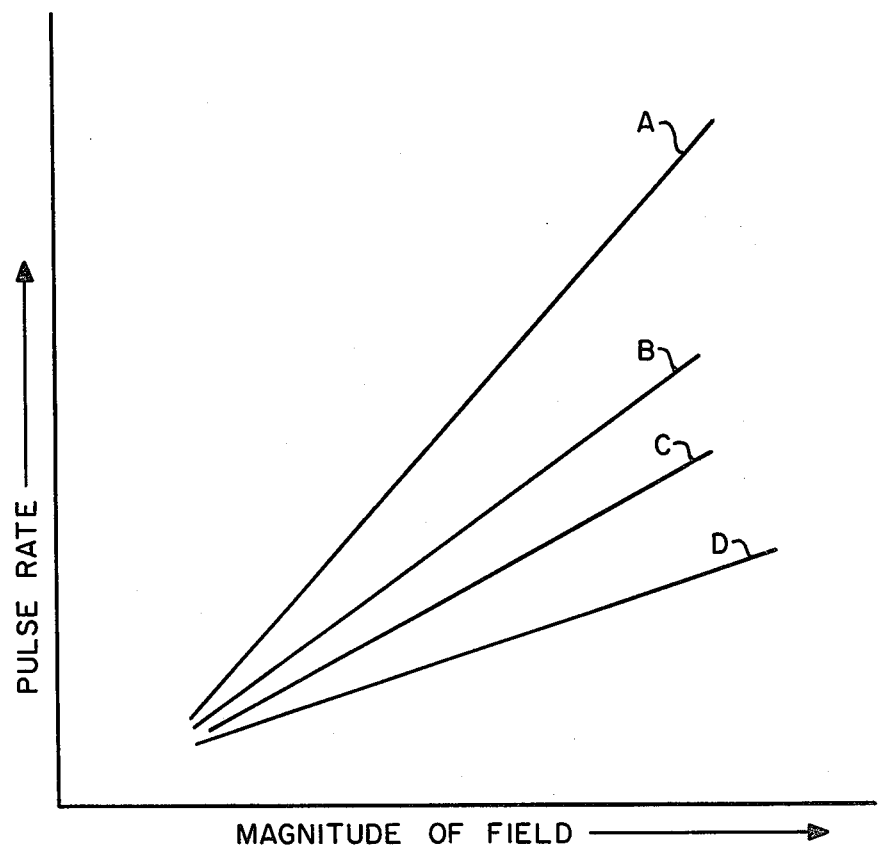
FIG. 2 is a graph indicating results obtained from the apparatus of FIG. 1 under a number of different conditions.

In practice, it has been found that a bulb of glass having a nominal diameter of 1 inch provides satisfactory results. The graph of FIG. 2 indicates the nature of the initial experimental results obtained with such a bulb when filled with neon at different pressures. The line indicated at A represents a pressure of 1 torr and the lines B, C and D represent pressures of 5, 10 and 30 torr respectively. It can be seen from this graph that as the pressure in a bulb of fixed diameter increases, the average frequency of the pulses decreases.

Although the theory of the phenomena is not yet fully understood, it has been found that the characteristics of the bulb 12 approximate to Paschens Law relating to discharge tubes. This states that the breakdown potential of a discharge tube is a function only of the pressure in the tube times the distance between the electrodes in the tube. In the present case, it has been found that the diameter of the bulb 12 behaves as the distance between the electrodes. A plot of the product of the pressure and diameter versus the breakdown voltage shows a minimum value of breakdown voltage at a particular product, this value being referred to as the threshold voltage. The diameter of the bulb and the pressure in the bulb may thus be varied whilst maintaining the threshold voltage constant, and thereby obtaining the desired sensitivity of the apparatus. For example, an increase in the diameter of the bulb will reduce the threshold field to which the apparatus responds and thereby increase the sensitivity of the apparatus.

Figure 3:
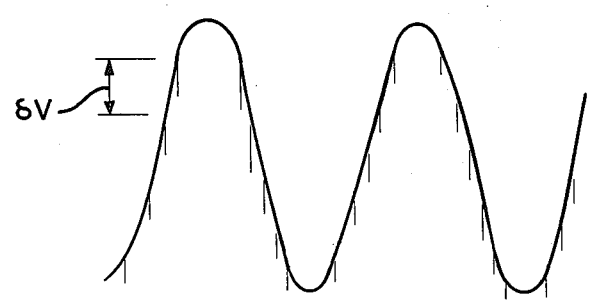
FIG. 3 is a diagrammatic representation of the phenomena upon which the electric field apparatus depends.

FIG. 3 shows the plot of a typical time varying electric field as a sine curve with intercepts on the curve indicating the emission of a pulse of electromagnetic radiation. As presently understood, the intercepts occur at increments of voltage change $\delta V$ so that for a given peak to peak voltage change, there will be a constant number of pulses. By counting these pulses over a relatively long period, typically 2 seconds for a 50 or 60 $H_z$ electric field, an indication of the magnitude of the field may be obtained. Obviously, as the peak to peak voltage increaases, the number of pulses increases and so the count in a unit time also increases. It is preferable to average the number of pulses over a number of cycles for statistical reasons.

It has been found that the number of pulses produced for a given change in magnitude of the field is independent of the frequency of the time varying field although of course the number of pulses per unit time will increase as the frequency of the field increases. The apparatus has been successfully tested over a frequency range of 1-600 $H_z$ and it is expected that higher frequencies may be used. It will be apparent that the relative magnitude of the field at different locations can still be obtained even if the frequency of the time varying field is not known by simply comparing the total number of pulses at the different locations in a unit time. If the frequency of the time varying field is known then an absolute value of the field can be obtained as well as comparative values.

Neon has been used since it is readily available however, it has been found that alternative gas, such as mercury vapour or Xeon, may be used and it is believed that a gas that exhibits low ionization potential will be most useful.

The bulb may be made from a dielectric material that transmits electromagnetic radiation and both pyrex and quartz have been used. It has been found that humidity within the housing 14 can affect the detector operation by altering the conductivity of the bulb and it is therefore preferable to seal the housing 14. In order to reduce the formation of thin water films, the housing has been formed from teflon and this has operated satisfactorily in humidities of up to 100% RH. An alternative construction of housing is the use of lucite coated with a water repellant, known as "Insul Jel", which is used on insulators on power transmission lines.

The use of dielectric material for the optic fibre bundle avoids perturbation of the field being measured and effectively limits noise caused by the field to be transmitted to the amplifier and recording devices. However, it has been found that certain optic fibre bundles do have appreciable conductivity, in the order of 50 M$\Omega$/m. This does not eliminate the pulse, but does modify the nature of the pulses to a certain extent, and therefore, should be avoided for general application.

The preferred embodiment has been described in use with a field generated by an alternating current, but it has been found that the detection device will emit a pulse wherever the magnitude of the field varies by more than the threshhold voltage. Thus when the detector is placed adjacent a d.c. conductor a pulse will be emitted whenever the current through the conductor is switched on or off. Therefore, the detector may be used to record the number of times a conductor is switched on or provide a warning that the current in a conductor has changed.

It can be seen therefore that the detector may be used in a wide variety of applications whenever an indication of a change in magnitude of an electric field is required.

By selecting a spherical bulb, the detector is not sensitive to directional variations so that placement of the bulb is not critical. Obviously, a number of detectors may be placed around an installation and the signals fed into a central station to enable an overall view of the electric field around an installation to be monitored constantly. Its small size and light weight make the device ideal for monitoring on a personal level. The amplifier and microprocessor may be arranged in a convenient pack which can be worn on the belt of personnel and connected by the fibre optic bundle to the detector mounted at a suitable location (most likely the head). The microprocessor may record field levels periodically, for example every $\frac{1}{2}$ hour, and subsequently transmit this information to a data collection system. The data collection system may then produce a hystogram to indicate the exposure of the personnel over a period of time.

It will be seen therefore that a simple versatile detection device has been provided which overcomes problems associated with the prior art.

What I claim as my invention is:

1. A detection device for detecting changes in the magnitude of an electric field to which the device is subjected comprising a sealed bulb of dielectric material, said bulb containing a gaseous medium which generates pulses of electromagnetic radiation when subjected to changes in the magnitude of an electric field, transmitting means associated with said bulb and operable to transmit said pulses to pulse delection means, said pulse detection means producing a discrete output signal for each of said transmitted pulses, and counting means selectively operable to count each of said discrete output signals and thereby provide an indication of the changes in the magnitude of the electric field.

2. A detection device according to claim 1 wherein said transmitting means includes an optic fibre bundle.

3. A detection device according to claim 2 wherein said bulb is located within a housing formed of dielectric material and said bundle enters said housing and terminates adjacent said bulb.

4. A detection device according to claim 3 wherein said housing is sealed.

5. A detection device according to claim 1 wherein said gaseous medium is selected from the group comprising neon, Xeon or mercury vapour.

6. A detection device for detecting changes in the magnitude of an electric field comprising, a housing formed from a dielectric material, a sealed bulb located within said housing and containing a gaseous medium selected from the group comprising neon, xeon or mercury vapour, an optical fibre bundle extending through a wall of said housing and having one end located adjacent said bulb and the other end connected to a photodetector, wherby upon placement of said housing in a time varying electric field, said gaseous medium generates pulses of electromagnetic radiation which are transmitted by the optical fibre bundle to said photodetector, said photodetector providing a discrete output signal for each of said pulses and counting means connected to said photodetector to count the discrete output signals and thereby provide an indication of the changes in the magnitude of the electric field.

7. A method of determining the changes in the magnitude of an electric field comprising the steps of placing in said field a detector comprising a sealed bulb of dielectric material containing a gaseous medium, whih generates pulses of electromagnetic when subjected to variations in magnitude of said electric field, transmitting pulses generated by said gaseous medium to a detection device and recording the number of pulses generated in unit time.

8. A detection device according to claim 1 wherein timing means are provided to determine the number of discrete signals in unit time and thereby indicated the changes in magnitude of the electric field.

9. A detection device according to claim 1 including a threshhold detector between said pulse detection means and said counting means to prevent recording of output signals below a predetermined level.

10. A detection device according to claim 1 including means to sample periodically said output signals and record the frequency of said pulses for future reference.

* * * * *

UNITED STATES PATENT AND TRADEMARK OFFICE
CERTIFICATE OF CORRECTION

PATENT NO. : 4,386,315
DATED      : May 31, 1983
INVENTOR(S) : Jeff F. Young et al It is certified that error appears in the above-identified patent and that said Letters Patent are hereby corrected as shown below:

On the title page, correct the name of the assignee as follows:

[73] Assignee: Friedmann, Young and Associates Inc.

Signed and Sealed this

Fifteenth Day of May 1984

[SEAL]

*Attest:*

GERALD J. MOSSINGHOFF

*Attesting Officer*  *Commissioner of Patents and Trademarks*